(12) United States Patent
Pelletier et al.

(10) Patent No.: US 11,088,517 B1
(45) Date of Patent: Aug. 10, 2021

(54) CLOSURE PLATES FOR ELECTRICAL ENCLOSURES

(71) Applicant: ABB Schweiz AG, Baden (CH)

(72) Inventors: Jean-Michel Pelletier, Lacolle (CA);
Alexandre Santerre, Longueuil (CA)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/994,760

(22) Filed: Aug. 17, 2020

(51) Int. Cl.
*H02G 3/08* (2006.01)

(52) U.S. Cl.
CPC .............. *H02G 3/088* (2013.01); *H02G 3/083* (2013.01)

(58) Field of Classification Search
CPC .......... H02G 3/088; H02G 3/083; H05K 5/06; H05K 5/069
See application file for complete search history.

(56) References Cited

U.S. PATENT DOCUMENTS

2019/0386473 A1* 12/2019 Kawashita .......... B60R 16/0238

* cited by examiner

*Primary Examiner* — Timothy J Thompson
*Assistant Examiner* — Amol H Patel
(74) *Attorney, Agent, or Firm* — Barnes & Thornburg LLP (57) ABSTRACT

Illustrative embodiments of electrical systems and methods may include an electrical enclosure to house electrical components. The electrical enclosure may have an enclosure opening configured to receive an electrical connection. A closure plate may be positionable over the enclosure opening to prevent water from entering the enclosure opening. The closure plate may include a closure plate recess formed in a bottom surface of the closure plate and configured to retain water such that the retained water acts as a seal to prevent additional water from entering the electrical enclosure through the enclosure opening.

20 Claims, 12 Drawing Sheets

CLOSURE PLATES FOR ELECTRICAL ENCLOSURES

TECHNICAL FIELD

The present disclosure relates, generally, to electrical enclosures and, more particularly, to closure plates for electrical enclosures.

BACKGROUND

Generally, an electrical enclosure is configured to house electrical equipment, for example, an electrical meter. The electrical enclosure typically includes enclosure openings on both the top and bottom of the electrical enclosure. Each enclosure opening enables electrical connections to be wired into the electrical enclosure. If electrical equipment within an electrical enclosure is wired from the bottom of the electrical enclosure, the enclosure opening at the top of the electrical enclosure must be sealed with a closure plate. If the electrical equipment is wired from the top of the electrical enclosure, the enclosure opening at the top of the electrical enclosure must be fitted with a closure plate in the form of a mounting hub having a threaded opening for receiving a conduit for the electrical connection.

The closure plate must be sealed to the electrical enclosure following CSA standards that limit an amount of water that may pass between the closure plate and the electrical enclosure. In some cases, the closure plate must meet 3R certification and be "rain-tight." Typically, the closure plate is sealed with a gasket that positions between the closure plate and the outer surface of the electrical enclosure. However, gaskets often wear down over time and fail, resulting in water entering the electrical enclosure.

SUMMARY

The present disclosure includes one or more of the features recited in the appended claims and/or the following features which, alone or in any combination, may comprise patentable subject matter.

According to one aspect of the present disclosure, an electrical system may comprise an electrical enclosure for housing an electrical component. The electrical enclosure may include an outer surface defining an enclosure opening for receiving an electrical connection for the electrical component. The electrical system may further comprise a closure plate including a bottom surface positionable against the outer surface of the electrical enclosure. A closure plate recess may be formed in the bottom surface and extend around a perimeter of the closure plate. The closure plate recess may be configured to retain water such that the retained water acts as a seal to prevent additional water from entering the electrical enclosure through the enclosure opening.

In some embodiments, the closure plate may be gasket-less. The perimeter of the closure plate may be defined by four sides, and the channel may extend along each of the four sides. The bottom surface of the closure plate may comprise (i) an outer rim extending around an outer perimeter of the closure plate and (ii) an inner rim positioned inward from the outer rim. The closure plate recess may be a channel extending between the outer rim and the inner rim. The closure plate may include at least one bore positioned inward of the inner rim of the bottom surface. The at least one bore may be configured to receive a fastener to secure the closure plate to the electrical enclosure. The electrical system may further comprise a deformable rim configured to seal the at least one bore when a fastener is received in the at least one bore.

In some embodiments, the closure plate may be a mounting hub having a mounting hub opening configured to receive a conduit carrying the electrical connection. The closure plate may be an adapter closure plate having a closure plate opening that is smaller than the enclosure opening. The mounting hub may be positionable on the adapter closure plate to prevent water from entering the electrical enclosure through the closure plate opening. The adapter closure plate and the mounting hub may be gasket-less.

In some embodiments, the mounting hub may include a mounting hub bottom surface positionable against the adapter closure plate. A mounting hub recess may be formed in the mounting hub bottom surface and extend around a perimeter of the mounting hub. The mounting hub recess may be configured to retain water such that the retained water acts as a seal to prevent additional water from entering the electrical enclosure through the closure plate opening. The mounting hub recess may be formed as a channel in the mounting hub bottom surface. The perimeter of the mounting hub may be defined by four sides, and the channel may extend along each of the four sides.

According to another aspect of the present disclosure, an electrical system may comprise an electrical enclosure for housing an electrical component. The electrical enclosure may include an outer surface defining an enclosure opening for receiving an electrical connection for the electrical component. The electrical system may further comprise an adapter closure plate having a closure plate opening that is smaller than the enclosure opening. The adapter closure plate may include a closure plate bottom surface positionable against the outer surface of the electrical enclosure. A closure plate recess may be formed in the closure plate bottom surface and configured to retain water such that the retained water acts as a seal to prevent additional water from entering the electrical enclosure through the enclosure opening. The electrical system may further comprise a mounting hub having a mounting hub opening configured to receive a conduit carrying the electrical connection. The mounting hub may include a mounting hub bottom surface positionable against the adapter closure plate. A mounting hub recess may be formed in the mounting hub bottom surface and configured to retain water such that the retained water acts as a seal to prevent additional water from entering the electrical enclosure through the closure plate opening.

In some embodiments, the adapter closure plate and the mounting hub may be gasket-less. The closure plate recess may extend around a perimeter of the adapter closure plate, and the mounting hub recess may extend around a perimeter of the mounting hub. The perimeter of the adapter closure plate may be defined by four closure plate sides, and the closure plate recess may extend along each of the four closure plate sides. The perimeter of the mounting hub may be defined by four mounting hub sides, and the mounting hub recess may extend along each of the four mounting hub sides.

According to yet another aspect of the present disclosure, a closure plate for an electrical enclosure may comprise an upper surface configured to be positioned over an enclosure opening defined in the electrical enclosure, a bottom surface extending around a perimeter of the closure plate and configured to contact the electrical enclosure, and a closure plate recess formed in the bottom surface and configured to retain water such that the retained water acts as a seal to prevent additional water from entering the electrical enclosure through the enclosure opening.

In some embodiments, the closure plate may be gasketless. The closure plate recess may extend around the entire perimeter of the closure plate.

BRIEF DESCRIPTION OF THE DRAWINGS

The concepts described in the present disclosure are illustrated by way of example and not by way of limitation in the accompanying drawings. Where considered appropriate, reference labels have been repeated among the drawings to indicate corresponding or analogous elements. The detailed description particularly refers to the accompanying figures in which.

DETAILED DESCRIPTION OF THE DRAWINGS

While the concepts of the present disclosure are susceptible to various modifications and alternative forms, specific embodiments thereof have been shown by way of example in the figures and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Figure 1:
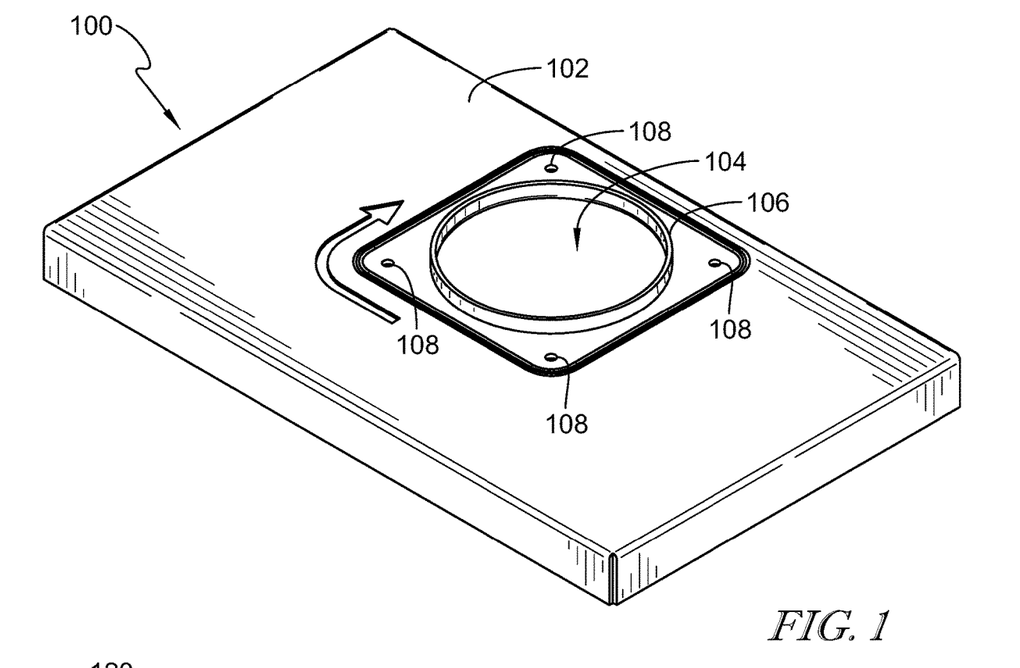
FIG. 1 is a top perspective view of an electrical enclosure having an enclosure opening extending through an outer surface.

Referring to FIG. 1, an electrical enclosure 100 is configured to house one or more electrical components (not shown), such as an electrical meter, by way of example. The electrical enclosure 100 includes an outer surface 102. An enclosure opening 104 extends through the outer surface 102 and is configured to receive an electrical connection (not shown) that couples to the electrical component. The opening 104 may have varying sizes, for example a 2.5 inch diameter or a 4 inch diameter. A flange 106 extends around a perimeter of the opening 104 upward from the outer surface 102. Additionally, four bores 108 are formed in the outer surface 102 around the flange 106. The bores 108 are configured to receive fasteners, for example screws, that secure a closure plate (described below) to the electrical enclosure 100.

Figure 2:
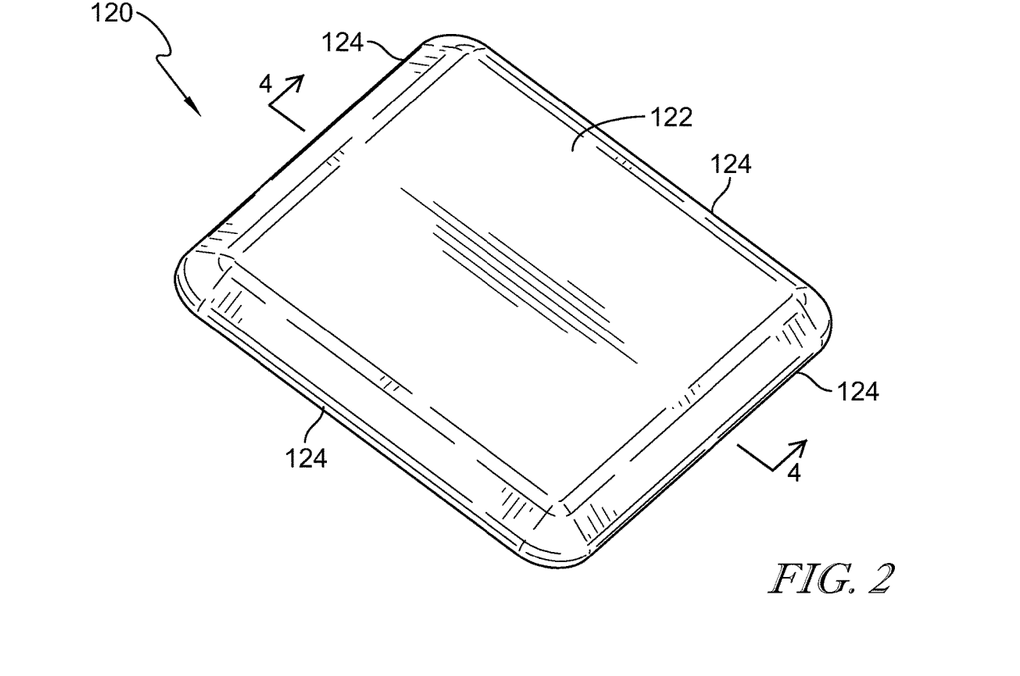
FIG. 2 is a top perspective view of a closure plate formed in accordance with one embodiment.
Figure 3:
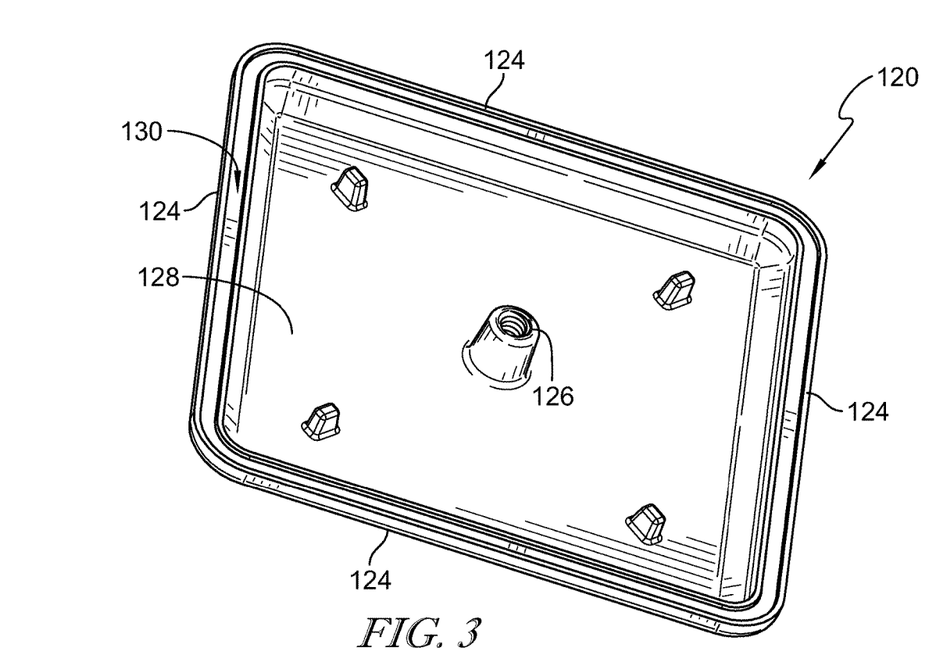
FIG. 3 is a bottom perspective view of the closure plate of FIG. 2.

Referring now to FIGS. 2 and 3, a closure plate 120 is sized to position over the enclosure opening 104. That is, the closure plate 120 may be sized to position over a 2.5 inch opening or a 4 inch opening. As shown in FIG. 2, the closure plate 120 includes a flat outer surface 122 having four sides 124. In some embodiments, the closure plate 120 may be circular or have a different number of sides. The flat outer surface 122 is devoid of openings. As shown in FIG. 3, a screw hole 126 extends from a bottom surface 128 of the closure plate 120. The screw hole 126 enables the closure plate 120 to be secured to a fastener (not shown) that extends from the enclosure opening 104. In this way, the closure plate 120 secures to the electrical enclosure 100 without any openings formed in the outer surface 122 of the closure plate 120, as shown in FIG. 5.

Figure 4:
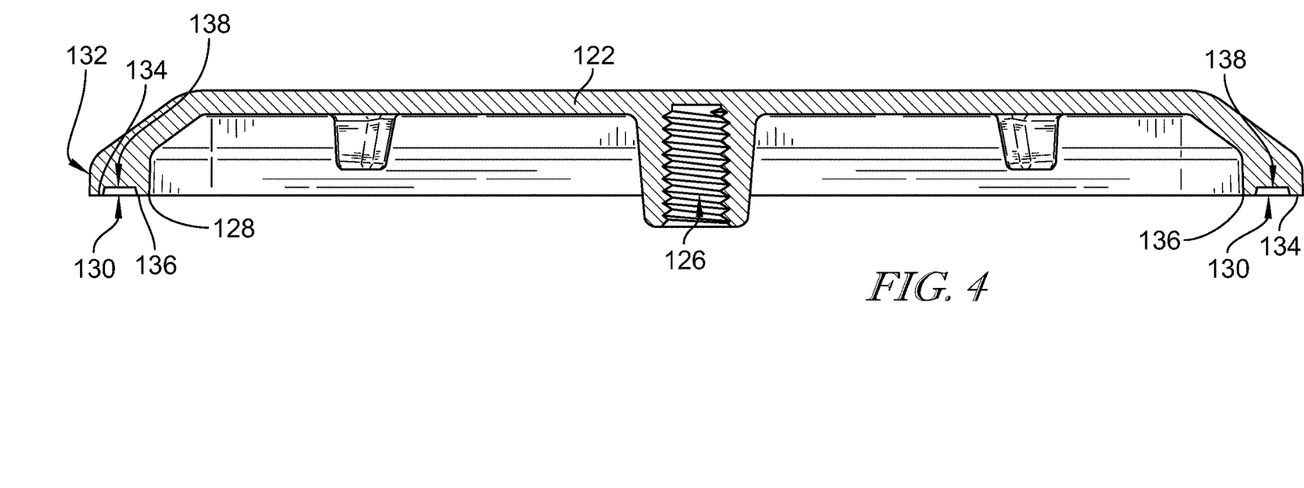
FIG. 4 is a cross-sectional view of the closure plate of FIG. 2, taken along line 4-4 in FIG. 2.

The bottom surface 128 of the closure plate 120 also includes a recess 130 that extends around a perimeter 132 of the closure plate 120. Referring to FIG. 4, the recess 130 includes an outer rim 134 that extends around the outer perimeter 132 of the closure plate 120. An inner rim 136 is positioned inward of the outer rim 134 and extends parallel to the outer rim 134 along each of the four sides 124 of the closure plate 120. A channel 138 extends between the outer rim 134 and the inner rim 136. The channel 138 extends along each of the four sides 124 of the closure plate 120.

Figure 5:
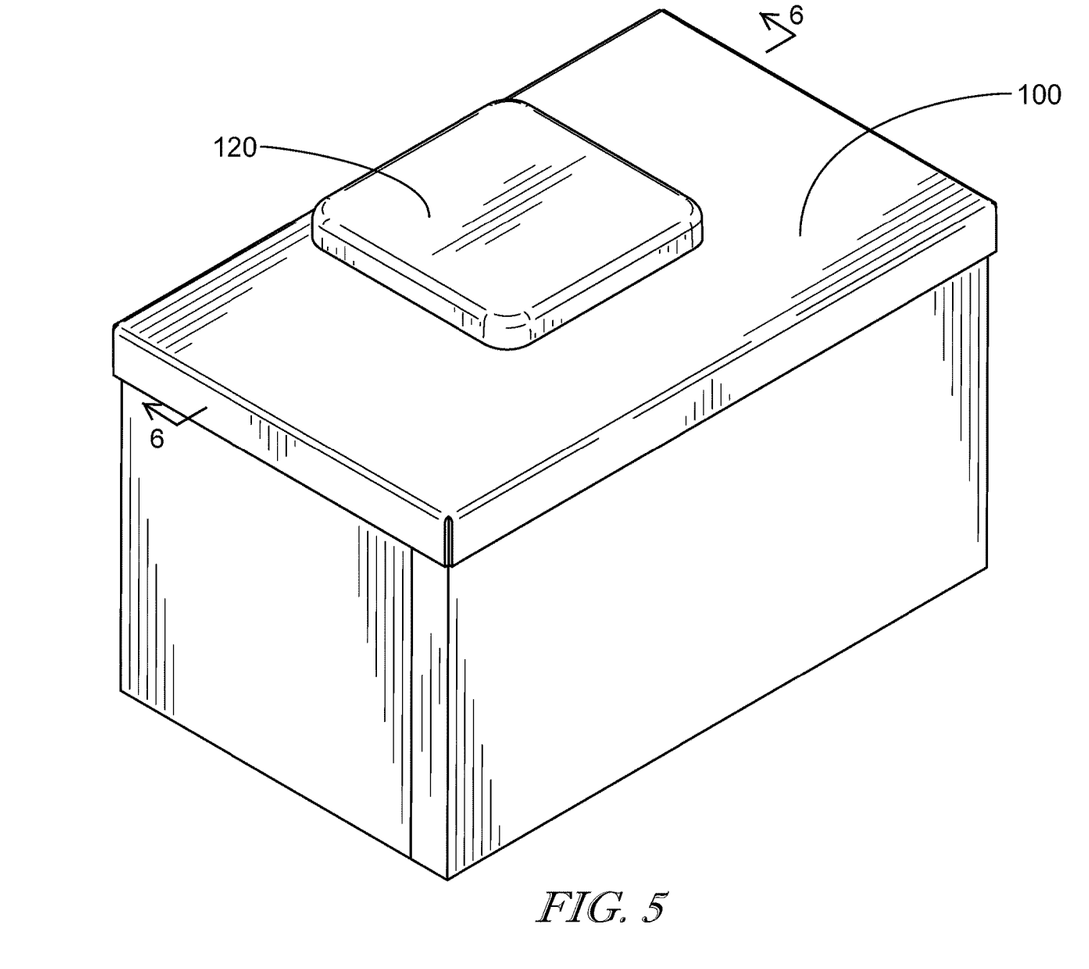
FIG. 5 is a top perspective view of the closure plate of FIG. 2 coupled to the electrical enclosure of FIG. 1.
Figure 6:
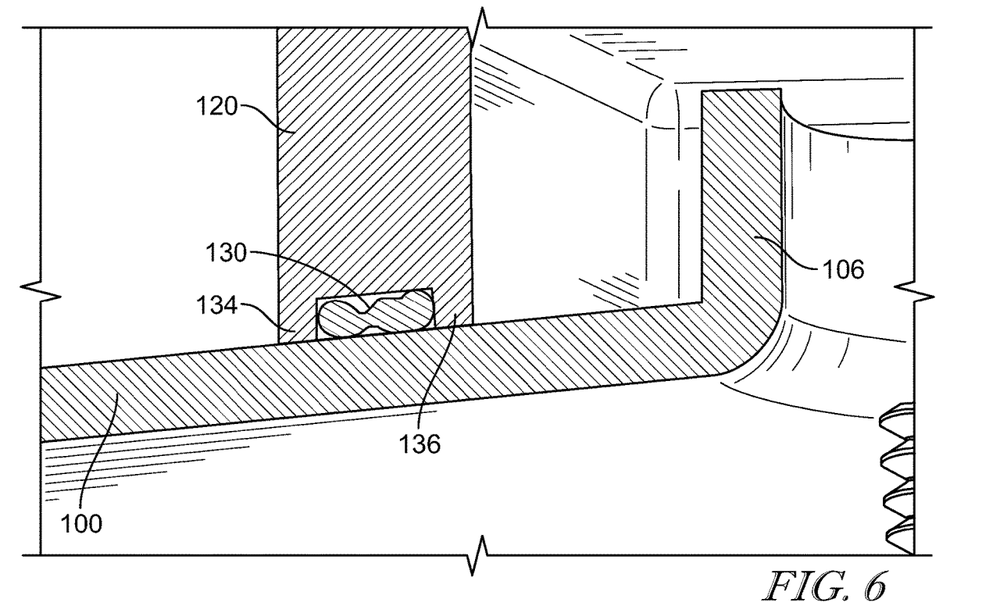
FIG. 6 is a partial cross-sectional view of the closure plate and electrical enclosure of FIG. 6, taken along line 6-6 in FIG. 5.

When the closure plate 120 is secured to the electrical enclosure 100, as shown in FIG. 5, the recess 130 forms a gasket-less seal between the closure plate 120 and the outer surface 102 of the electrical enclosure 100, as shown in FIG.

6. When water is retained in the recess 130, the retained water acts as a seal to prevent additional water from entering the enclosure opening 104. As used herein, the term "prevent" does not require total prevention but also includes partially preventing or otherwise limiting the intrusion of additional water into the electrical enclosure 100. A ratio of a height of the outer rim 134 and inner rim 136 to the distance between the outer rim 134 and the inner rim 136 may be altered to change the properties of the seal generated by the recess 130. The flange 106 forms an additional barrier against water entering the enclosure opening 104.

Figure 7:
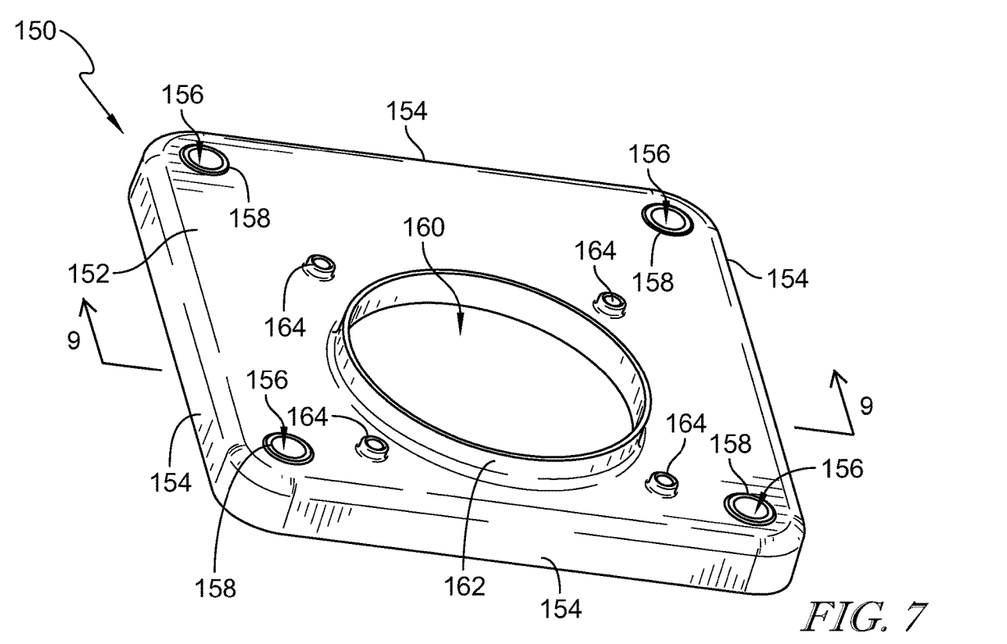
FIG. 7 is a top perspective view of a closure plate formed as an adapter closure plate in accordance with another embodiment.

Referring now to FIG. 7, a closure plate 150 is formed as an adapter closure plate. The closure plate 150 is configured to cover a 4 inch enclosure opening 104 and providing an opening of 2.5 inches. The closure plate 150 includes an outer surface 152 having four sides 154. In some embodiments, the closure plate 150 may be circular or have a different number of sides 154. The closure plate 150 includes bores 156 that are configured to receive a fastener. The fastener is inserted into the bore 156 and extended through the bore 108 secure the closure plate 150 to the electrical enclosure 100. A deformable rim 158 extends around each bore 156. When the fastener is secured in the bore 156, the deformable rim 158 deforms to seal the fastener to the closure plate 150 around the bore 156.

An opening 160 extends through the closure plate 150. The opening 160 is sized to 2.5 inches. A flange 162 extends around the opening 160. The opening 160 is configured to receive the electrical connection to connect to the electrical component in the electrical enclosure 100. Accordingly, the closure plate 150 functions as an adapter closure plate that reduces the opening from 4 inches to 2.5 inches. Bores 164 are positioned around the opening 160 and configured to receive a fastener to couple the closure plate 150 to a mounting hub, as described below.

Figure 8:
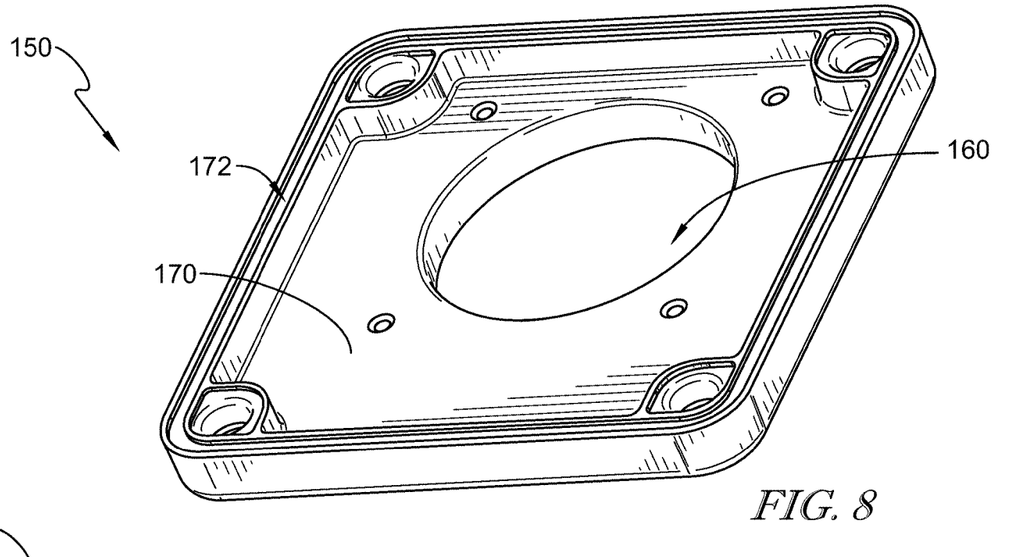
FIG. 8 is a bottom perspective view of the adapter closure plate of FIG. 7.
Figure 9:
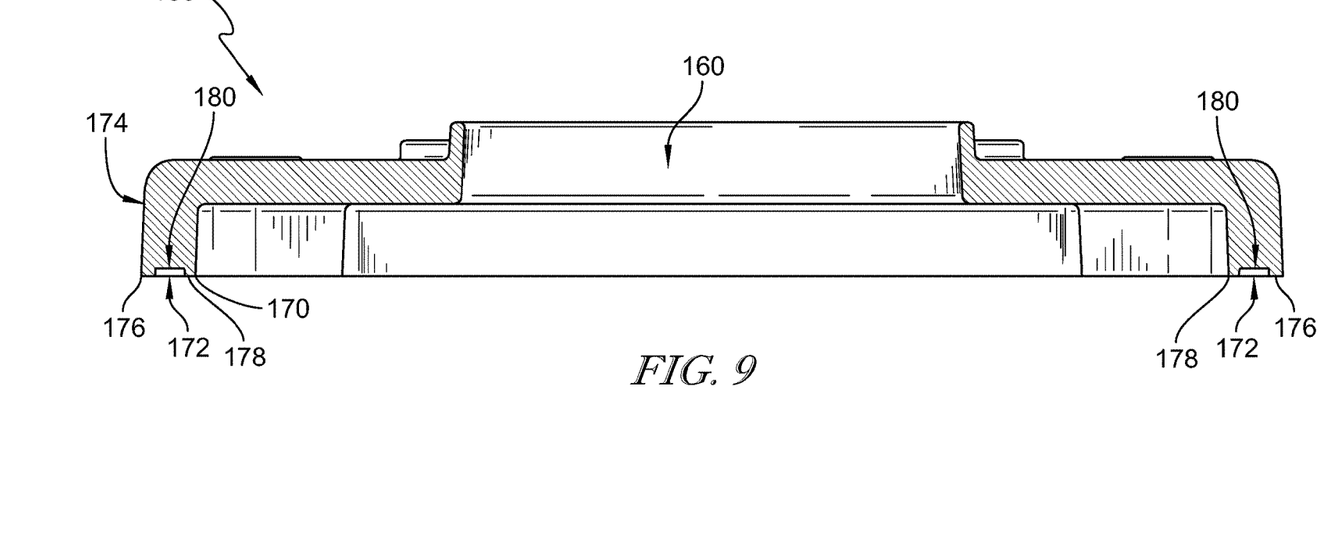
FIG. 9 is a cross-sectional view of the adapter closure plate of FIG. 7, taken along line 9-9 in FIG. 7.

Referring to FIG. 8, a bottom surface 170 of the closure plate 150 includes a recess 172 that extends around a perimeter 174 of the closure plate 150. As shown in FIG. 9, the recess 172 includes an outer rim 176 that extends around the outer perimeter 174 of the closure plate 150. An inner rim 178 is positioned inward of the outer rim 176 and extends parallel to the outer rim 176 along each of the four sides 154 of the closure plate 150. A channel 180 extends between the outer rim 176 and the inner rim 178. The channel 180 extends along each of the four sides 154 of the closure plate 150.

When the closure plate 150 is secured to the electrical enclosure 100, the recess 172 forms a gasket-less seal between the closure plate 150 and the outer surface 102 of the electrical enclosure 100. When water is retained in the recess 172, the retained water acts as a seal to prevent additional water from entering the enclosure opening 104. A ratio of a height of the outer rim 176 and inner rim 178 to the distance between the outer rim 176 and the inner rim 178 may be altered to change the properties of the seal generated by the recess 172. The flange 106 forms an additional barrier against water entering the enclosure opening 104.

Figure 10:
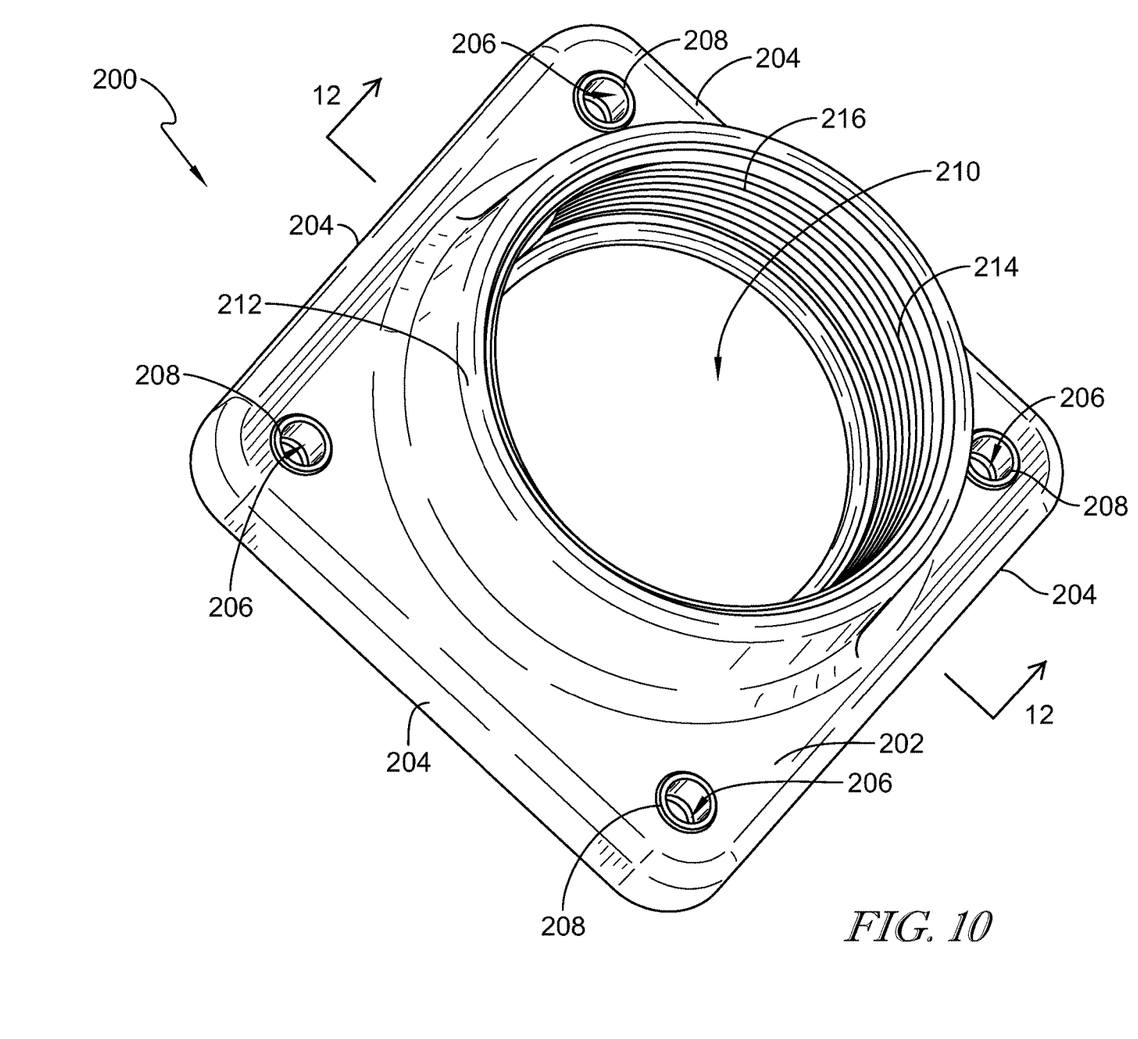
FIG. 10 is a top perspective view of a closure plate formed as a mounting hub in accordance with yet another embodiment.
Figure 13:
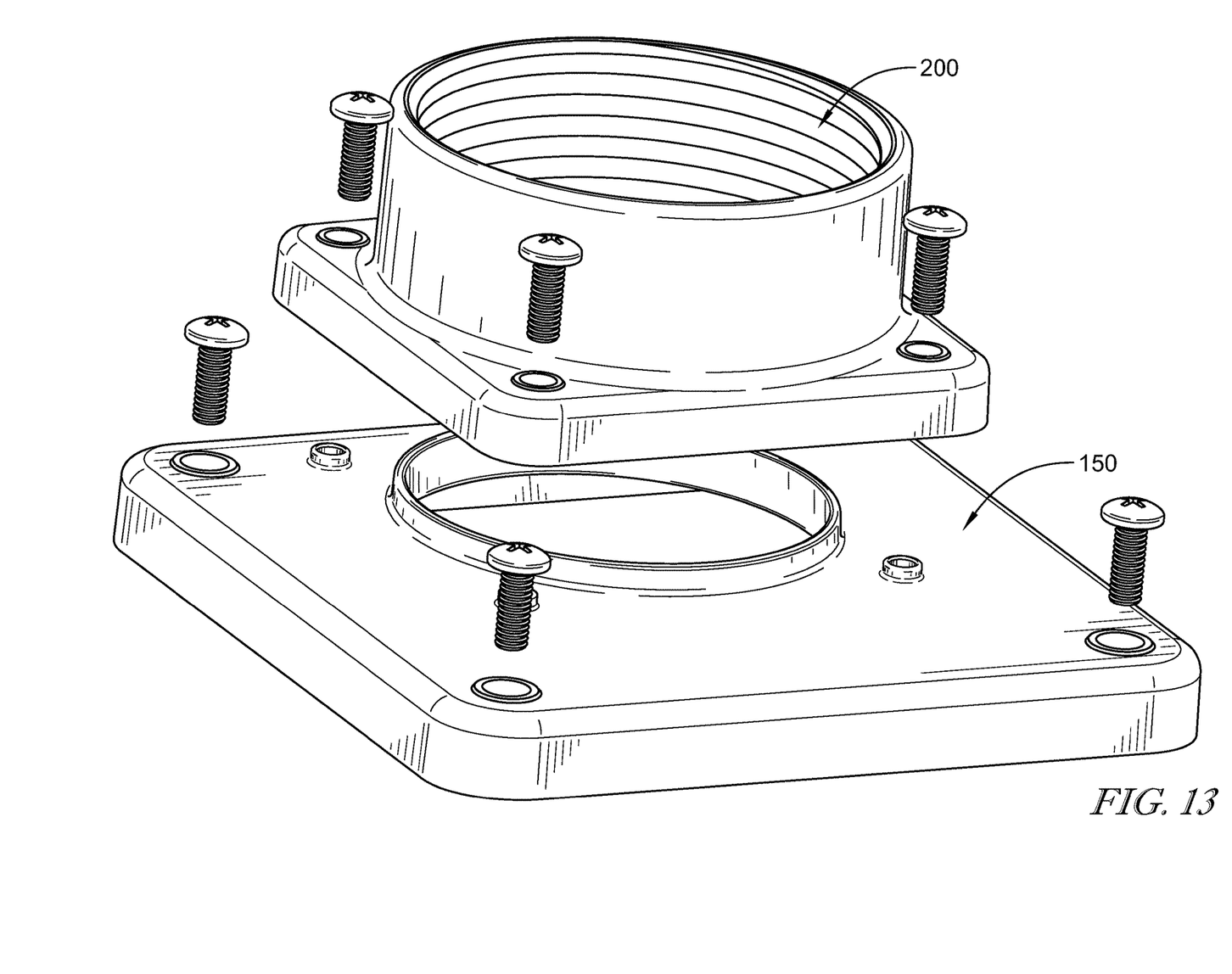
FIG. 13 is a top perspective, exploded view of the mounting hub of FIG. 10 being assembled to the adapter closure plate of FIG. 7.

Referring now to FIG. 10, a closure plate 200 is formed as a mounting hub that is configured to couple to the adapter closure plate 150. The mounting hub 200 is configured to couple to a 2.5 inch electrical connection. The mounting hub 200 includes an outer surface 202 having four sides 204. In some embodiments, the mounting hub 200 may be circular or have a different number of sides 204. The mounting hub 200 includes bores 206 that are configured to receive a fastener. The fastener is inserted into the bore 206 and extended through the bore 164 secure the mounting hub 200 to the closure plate 150, as shown in FIG. 13. A deformable rim 208 extends around each bore 206. When the fastener is secured in the bore 206, the deformable rim 208 deforms to seal the fastener to the mounting hub 200 around the bore 206.

An opening 210 extends through the mounting hub 200. The opening 210 is sized to 2.5 inches. A flange 212 extends around the opening 210 and includes threading 214 to secure to a conduit carrying one or more electrical connections. The threading 214 extends around an inner surface 216 of the flange 212. Accordingly, the closure plate 150 functions as an adapter closure plate that reduces the opening from 4 inches to 2.5 inches, and the mounting hub 200 enables a 2.5 inch conduit to be coupled to the electrical enclosure 100.

Figure 11:
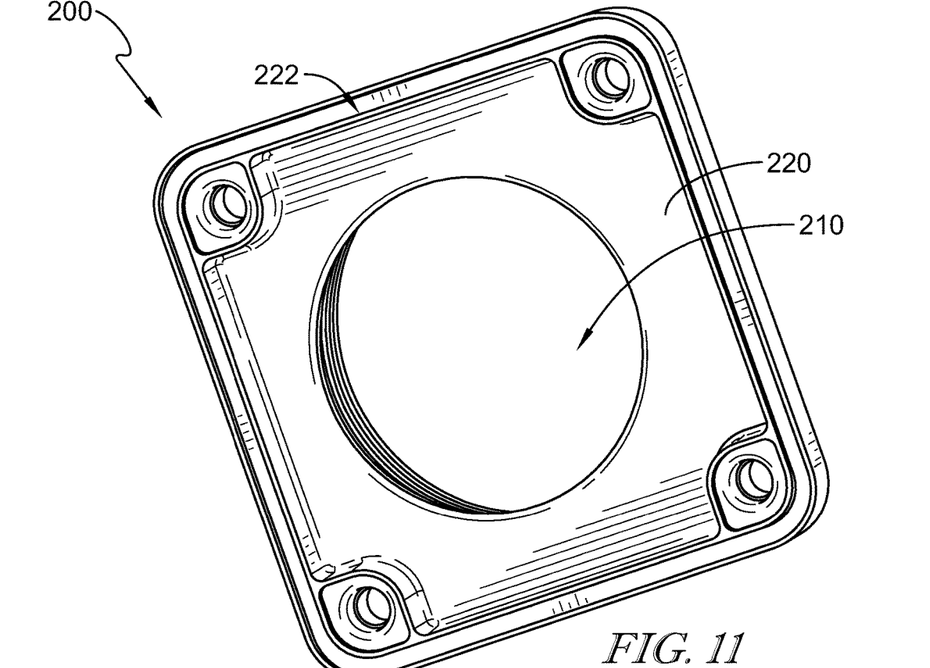
FIG. 11 is a bottom perspective view of the mounting hub of FIG. 10.
Figure 12:
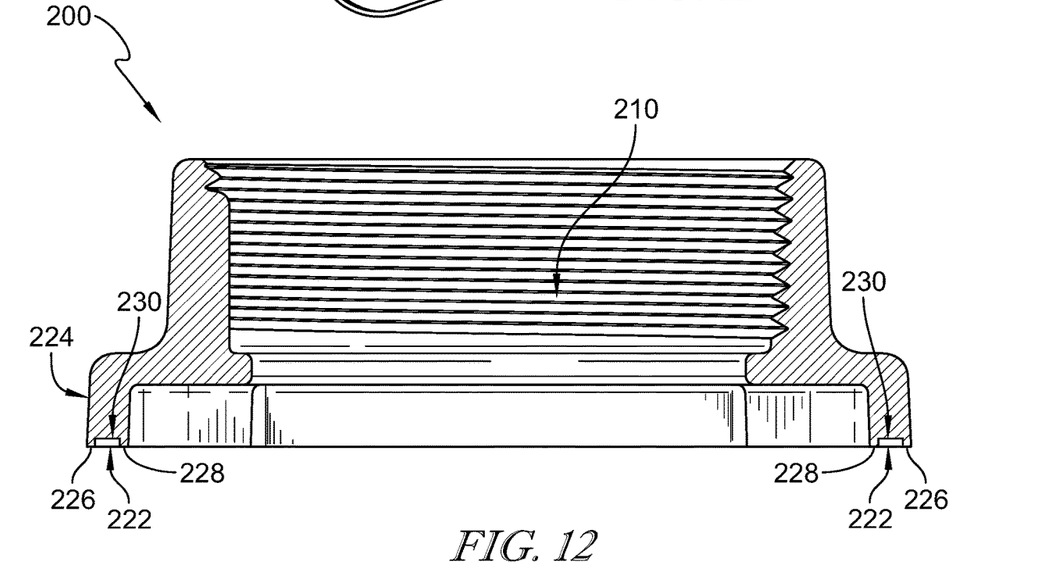
FIG. 12 is a cross-sectional view of the mounting hub of FIG. 10, taken along line 12-12 in FIG. 10.

Referring to FIG. 11, a bottom surface 220 of the mounting hub 200 includes a recess 222 that extends around a perimeter 224 of the mounting hub 200. As shown in FIG. 12, the recess 222 includes an outer rim 226 that extends around the outer perimeter 224 of the mounting hub 200. An inner rim 228 is positioned inward of the outer rim 226 and extends parallel to the outer rim 226 along each of the four sides 204 of the mounting hub 200. A channel 230 extends between the outer rim 226 and the inner rim 228. The channel 230 extends along each of the four sides 204 of the mounting hub 200.

Figure 14:
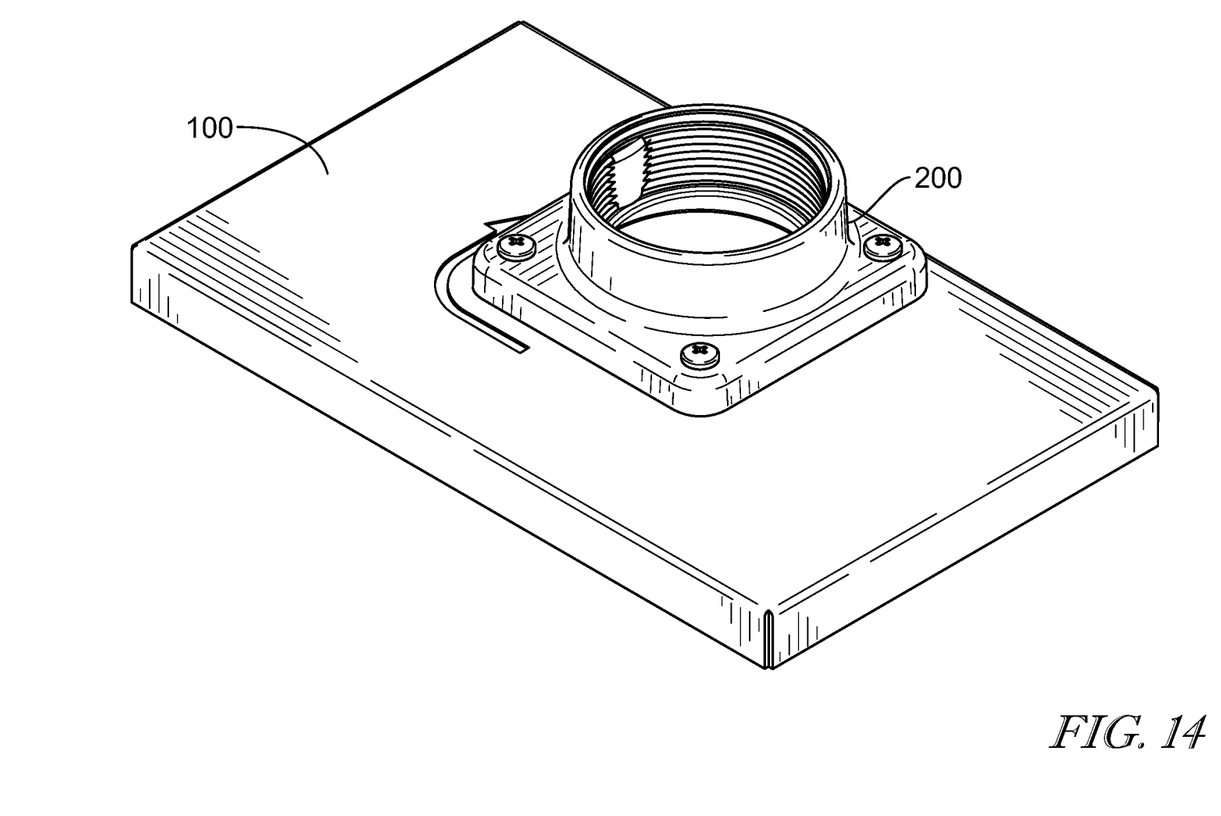
FIG. 14 is a top perspective view of the mounting hub of FIG. 10 assembled to the electrical enclosure of FIG. 1.

When the mounting hub 200 is secured to the closure plate 150, the recess 222 forms a gasket-less seal between the mounting hub 200 and the outer surface 152 of the closure plate 150. When water is retained in the recess 222, the retained water acts as a seal to prevent additional water from entering the opening 160 of the closure plate 150. A ratio of a height of the outer rim 226 and inner rim 228 to the distance between the outer rim 226 and the inner rim 228 may be altered to change the properties of the seal generated by the recess 222. The flange 162 forms an additional barrier against water entering the opening 160 of the closure plate 150. In alternative embodiments, such as shown in FIG. 14, the mounting hub 200 may be coupled directly to the electrical enclosure 100.

Figure 15:
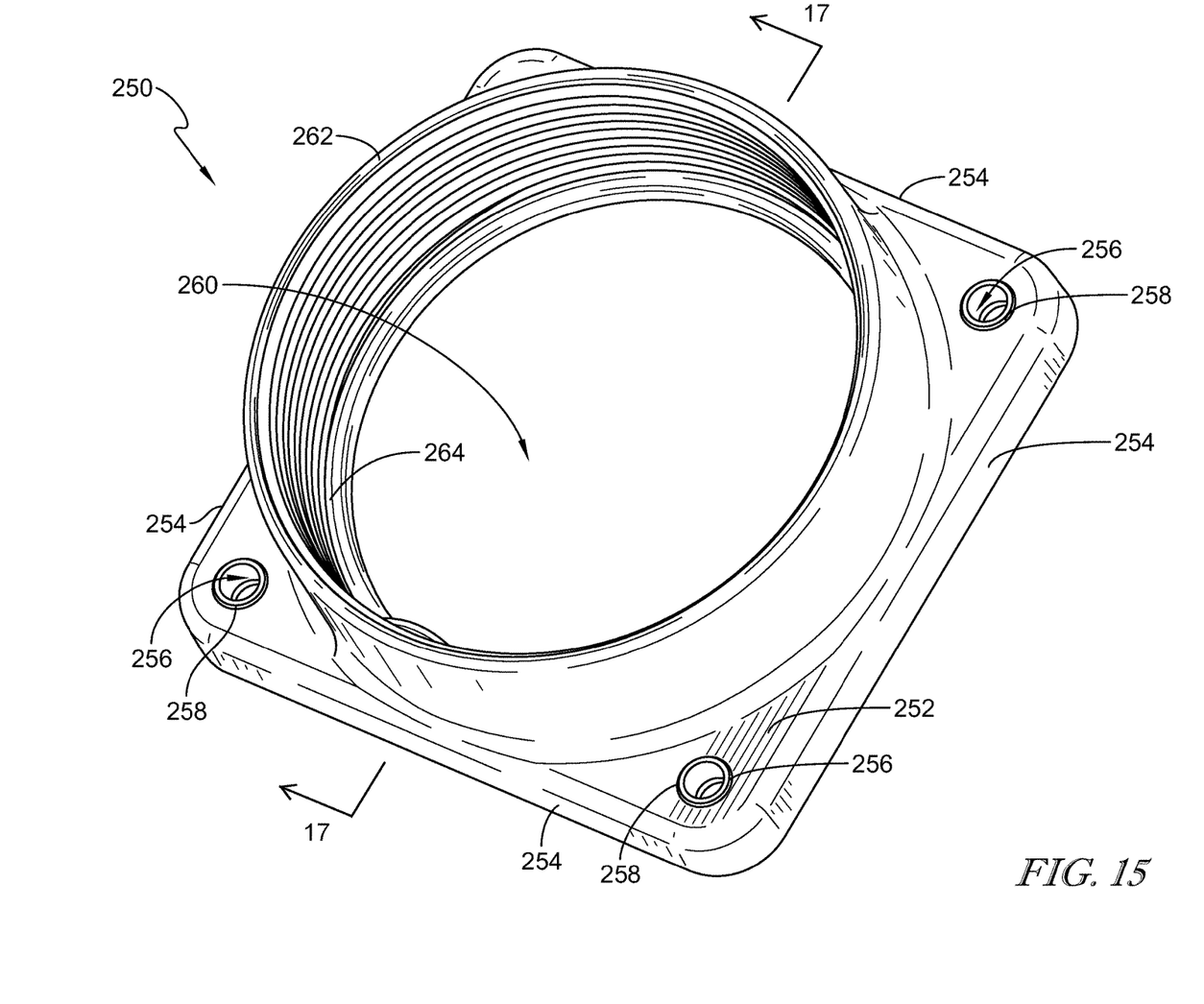
FIG. 15 is a top perspective view of a closure plate formed as a mounting hub in accordance with still another embodiment.

Referring now to FIG. 15, a closure plate 250 is formed as a mounting hub that is configured to couple to the electrical enclosure 100. The mounting hub 250 is configured to couple to a 4 inch electrical connection. The closure plate 250 includes an outer surface 252 having four sides 254. In some embodiments, the closure plate 250 may be circular or have a different number of sides 254. The closure plate 250 includes bores 256 that are configured to receive a fastener. The fastener is inserted into the bore 256 and extended through the bore 108 secure the mounting hub 250 to the electrical enclosure 100. A deformable rim 258 extends around each bore 256. When the fastener is secured in the bore 256, the deformable rim 258 deforms to seal the fastener to the mounting hub 250 around the bore 256.

An opening 260 extends through the mounting hub 250. The opening 260 is sized to 4 inches. A flange 262 extends around the opening 260 and includes threading 264 to secure to a conduit for carrying one or more electrical connections. The threading 264 extends around an inner surface 266 of the flange 262. The opening 260 is configured to receive the conduit to connect to the electrical component in the electrical enclosure 100.

Figure 16:
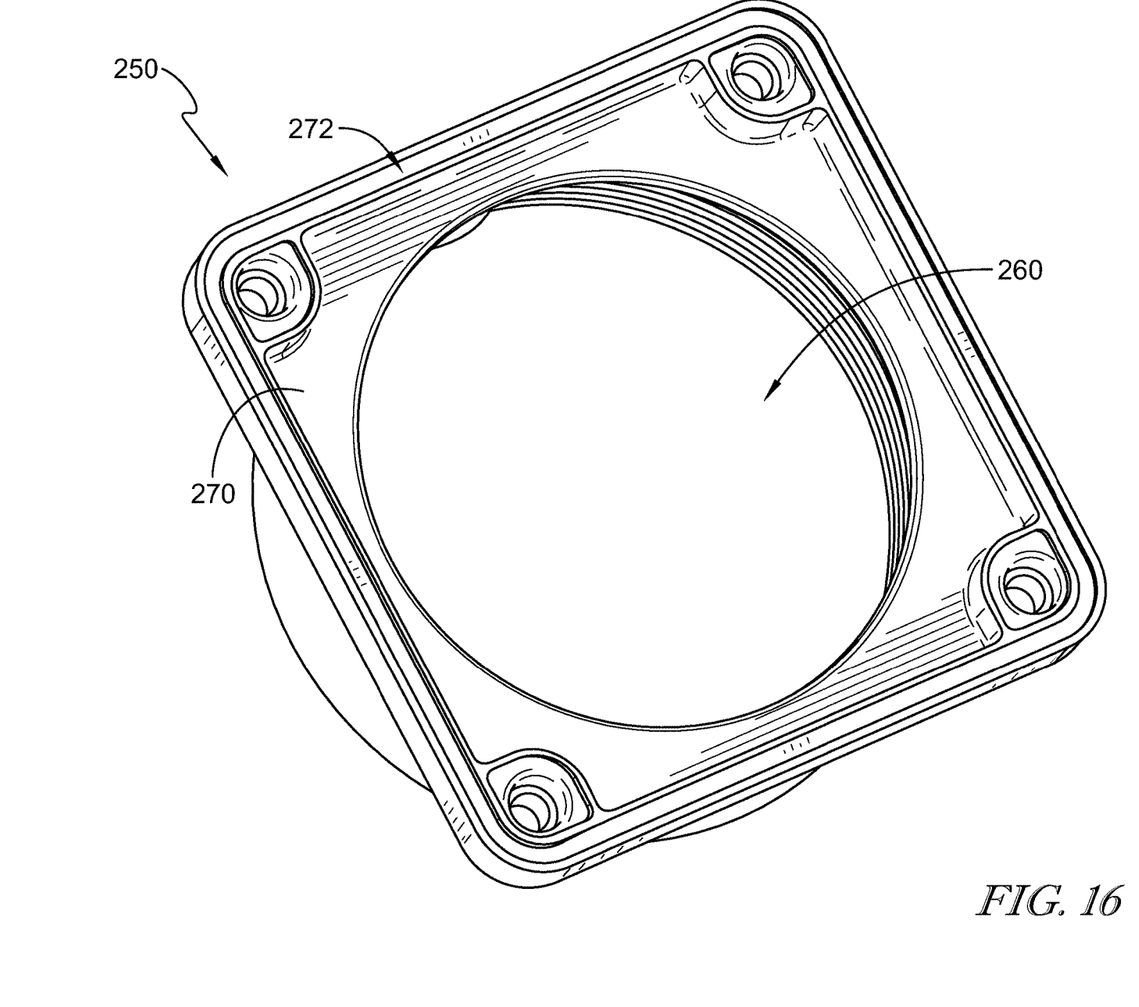
FIG. 16 is a bottom perspective view of the mounting hub of FIG. 15.
Figure 17:
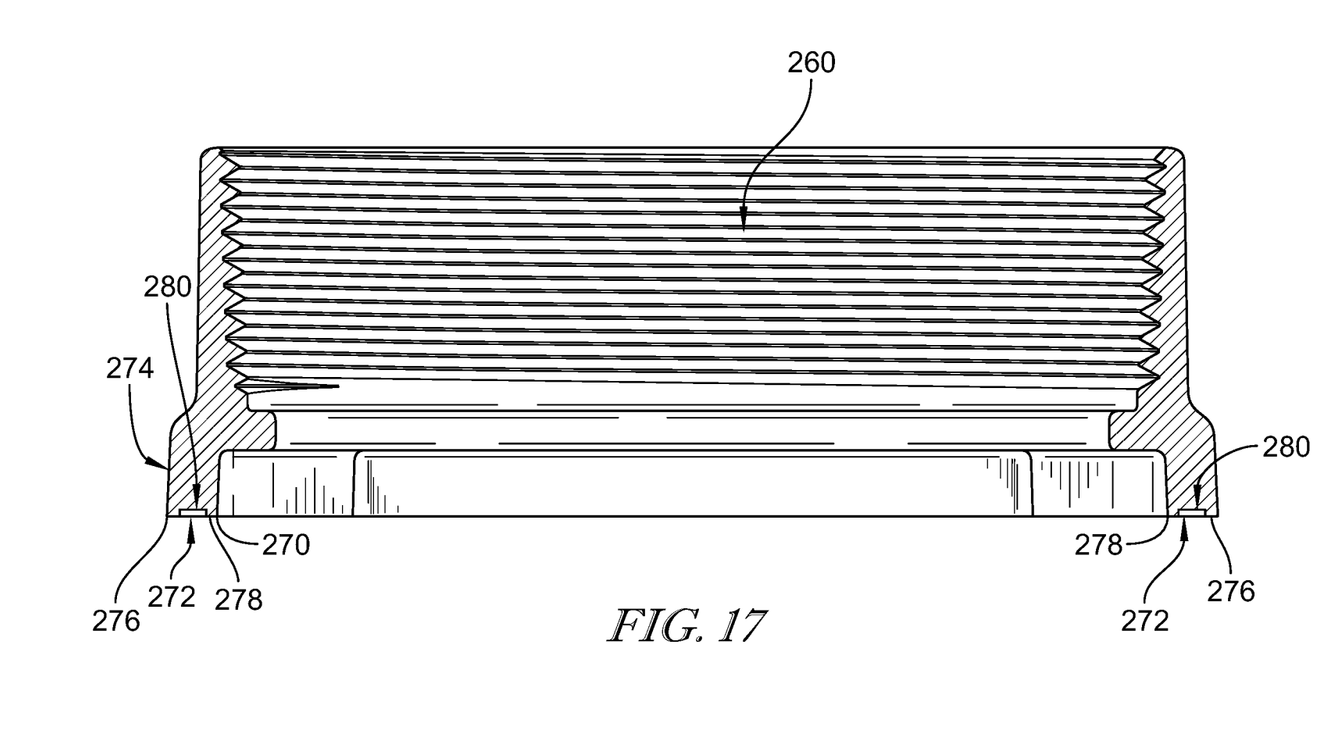
FIG. 17 is a cross-sectional view of the mounting hub of FIG. 15, taken along line 17-17 in FIG. 15.

Referring to FIG. 16, a bottom surface 270 of the mounting hub 250 includes a recess 272 that extends around a perimeter 274 of the mounting hub 250. As shown in FIG. 17, the recess 272 includes an outer rim 276 that extends around the outer perimeter 274 of the mounting hub 250. An inner rim 278 is positioned inward of the outer rim 276 and extends parallel to the outer rim 276 along each of the four sides 254 of the mounting hub 250. A channel 280 extends between the outer rim 276 and the inner rim 278. The channel 280 extends along each of the four sides 254 of the mounting hub 250.

When the mounting hub 250 is secured to the electrical enclosure 100, the recess 272 forms a gasket-less seal between the mounting hub 250 and the outer surface 102 of the electrical enclosure 100. When water is retained in the recess 272, the retained water acts as a seal to prevent additional water from entering the enclosure opening 104. A ratio of a height of the outer rim 276 and inner rim 278 to the distance between the outer rim 276 and the inner rim 278 may be altered to change the properties of the seal generated by the recess 272. The flange 106 forms an additional barrier against water entering the enclosure opening 104.

While certain illustrative embodiments have been described in detail in the figures and the foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the methods, systems, and articles described herein. It will be noted that alternative embodiments of the methods, systems, and articles of the present disclosure may not include all of the features described yet still benefit from at least some of the advantages of such features. Those of ordinary skill in the art may readily devise their own implementations of the methods, systems, and articles that incorporate one or more of the features of the present disclosure.

The invention claimed is:

1. An electrical system comprising:
   an electrical enclosure for housing an electrical component, the electrical enclosure including an outer surface defining an enclosure opening for receiving an electrical connection for the electrical component; and
   a closure plate including a bottom surface positionable against the outer surface of the electrical enclosure, wherein a closure plate recess is formed in the bottom surface and extends around a perimeter of the closure plate, the closure plate recess being configured to retain water such that the retained water acts as a seal to prevent additional water from entering the electrical enclosure through the enclosure opening.

2. The electrical system of claim 1, wherein the closure plate is gasket-less.

3. The electrical system of claim 1, wherein the perimeter of the closure plate is defined by four sides, and wherein the channel extends along each of the four sides.

4. The electrical system of claim 1, wherein the bottom surface of the closure plate comprises (i) an outer rim extending around an outer perimeter of the closure plate and (ii) an inner rim positioned inward from the outer rim, and wherein the closure plate recess is a channel extending between the outer rim and the inner rim.

5. The electrical system of claim 4, wherein the closure plate includes at least one bore positioned inward of the inner rim of the bottom surface, the at least one bore configured to receive a fastener to secure the closure plate to the electrical enclosure.

6. The electrical system of claim 5, further comprising a deformable rim configured to seal the at least one bore when a fastener is received in the at least one bore.

7. The electrical system of claim 1, wherein the closure plate is a mounting hub having a mounting hub opening configured to receive a conduit carrying the electrical connection.

8. The electrical system of claim 1, wherein the closure plate is an adapter closure plate having a closure plate opening that is smaller than the enclosure opening.

9. The electrical system of claim 8, further comprising a mounting hub having a mounting hub opening configured to receive a conduit carrying the electrical connection, wherein the mounting hub is positionable on the adapter closure plate to prevent water from entering the electrical enclosure through the closure plate opening.

10. The electrical system of claim 9, wherein the adapter closure plate and the mounting hub are gasket-less.

11. The electrical system of claim 9, wherein the mounting hub includes a mounting hub bottom surface positionable against the adapter closure plate, and wherein a mounting hub recess is formed in the mounting hub bottom surface and extends around a perimeter of the mounting hub, the mounting hub recess being configured to retain water such that the retained water acts as a seal to prevent additional water from entering the electrical enclosure through the closure plate opening.

12. The electrical system of claim 11, wherein the mounting hub recess is formed as a channel in the mounting hub bottom surface.

13. The electrical system of claim 12, wherein the perimeter of the mounting hub is defined by four sides, and wherein the channel extends along each of the four sides.

14. An electrical system comprising:
   an electrical enclosure for housing an electrical component, the electrical enclosure including an outer surface defining an enclosure opening for receiving an electrical connection for the electrical component;
   an adapter closure plate having a closure plate opening that is smaller than the enclosure opening, wherein the adapter closure plate includes a closure plate bottom surface positionable against the outer surface of the electrical enclosure, and wherein a closure plate recess is formed in the closure plate bottom surface and is configured to retain water such that the retained water acts as a seal to prevent additional water from entering the electrical enclosure through the enclosure opening; and
   a mounting hub having a mounting hub opening configured to receive a conduit carrying the electrical connection, wherein the mounting hub includes a mounting hub bottom surface positionable against the adapter closure plate, and wherein a mounting hub recess is formed in the mounting hub bottom surface and is configured to retain water such that the retained water acts as a seal to prevent additional water from entering the electrical enclosure through the closure plate opening.

15. The electrical system of claim 14, wherein the adapter closure plate and the mounting hub are gasket-less.

16. The electrical system of claim 14, wherein the closure plate recess extends around a perimeter of the adapter closure plate, and wherein the mounting hub recess extends around a perimeter of the mounting hub.

17. The electrical system of claim 16, wherein the perimeter of the adapter closure plate is defined by four closure plate sides, wherein the closure plate recess extends along each of the four closure plate sides, wherein the perimeter of the mounting hub is defined by four mounting hub sides, and wherein the mounting hub recess extends along each of the four mounting hub sides.

18. A closure plate for an electrical enclosure, the closure plate comprising:
an upper surface configured to be positioned over an enclosure opening defined in the electrical enclosure;
a bottom surface extending around a perimeter of the closure plate, the bottom surface being configured to contact the electrical enclosure; and
a closure plate recess formed in the bottom surface and configured to retain water such that the retained water acts as a seal to prevent additional water from entering the electrical enclosure through the enclosure opening.

19. The electrical system of claim 18, wherein the closure plate is gasket-less.

20. The electrical system of claim 18, wherein the closure plate recess extends around the entire perimeter of the closure plate.

* * * * *